United States Patent [19]

Nakamura et al.

[11] Patent Number: 5,748,967
[45] Date of Patent: May 5, 1998

[54] PROGRAM REWRITING METHOD AND APPARATUS FOR MULTIPROCESSOR SYSTEM

[75] Inventors: Takahiro Nakamura; Takafumi Oka, both of Odawara, Japan

[73] Assignee: Hitachi, Ltd., Tokyo, Japan

[21] Appl. No.: 179,200

[22] Filed: Jan. 10, 1994

[30] Foreign Application Priority Data

Jan. 11, 1993 [JP] Japan .................. 5-002622

[51] Int. Cl.⁶ .......................................... G06F 9/00
[52] U.S. Cl. ............... 395/712; 395/200.07; 395/200.08; 395/474
[58] Field of Search ..................... 395/425, 775, 395/474, 712, 200.07, 220.08, 492, 800; 364/147, 921, 921.2; 365/189.01, 189.07, 218

[56] References Cited

U.S. PATENT DOCUMENTS

| | | | |
|---|---|---|---|
| 4,843,540 | 6/1989 | Stolfo | 395/700 |
| 4,860,201 | 8/1989 | Stolfo | 395/800 |
| 5,053,990 | 10/1991 | Kreifels et al. | 395/425 |
| 5,127,089 | 6/1992 | Gay et al. | 395/325 |
| 5,168,442 | 12/1992 | Ikeda et al. | 364/147 |
| 5,361,363 | 11/1994 | Wells | 395/800 |
| 5,390,148 | 2/1995 | Saito | 365/189.07 |

FOREIGN PATENT DOCUMENTS

A-63-239697  10/1988  Japan.

Primary Examiner—Jack B. Harvey
Assistant Examiner—Jeffrey K. Seto
Attorney, Agent, or Firm—Antonelli, Terry, Stout, & Kraus, LLP

[57] ABSTRACT

In at least two microprocessor systems each having a microprocessor, a flash electrically erasable programmable read only memory (EEPROM), and a system bus connected to the microprocessor and the memory, there is disposed a controller between the system buses of the respective systems. The processor of one of the systems rewrites a program in the memory of a remaining system via the system bus of the remaining system.

16 Claims, 3 Drawing Sheets

PROGRAM REWRITING METHOD AND APPARATUS FOR MULTIPROCESSOR SYSTEM

BACKGROUND OF THE INVENTION

The present invention relates to a method of and an apparatus for rewriting programs or reprogramming for use with a microprocessor, and in particular, to a method of and an apparatus for rewriting execution programs or object codes stored in a programmable read only memory (PROM) externally disposed for each of a plurality of on-board processors.

Heretofore, some microprocessor systems of the prior art have been configured such that an object program is loaded from a floppy disk driving device (FDD) into a random access memory (RAM) integrally arranged in a microprocessor. In such a constitution, to alter the object program, a disk on which an executable program to replace the running program is required to be installed in the driving device.

Moreover, conventionally, there have been microprocessor systems in which PROMs each containing therein an executable program are mounted on an upper surface of a microprocessor in a piggyback fashion. According to the configuration, in order to change an object program, it is necessary to replace the current PROM related to the object program with a desired PROM of a new program mounted on the processor.

In addition, some microprocessor systems have been conventionally structured in such a fashion that an erasable PROM (for example, an EPROM of which the contents can be erased by an ultraviolet ray) is disposed in a microprocessor so as to write an executable program in the memory. This structure has already been described, for example, in the JP-A-63-239697. In the construction, there is necessitated an apparatus dedicated to the change or rewriting of the object program.

According to the prior arts above, for replacement of an executable program of a microprocessor, there has been required a floppy disk driver or a dedicated ROM; alternatively, there is necessitated a device exclusively used to rewrite an EPROM integrally arranged in the system. In addition, in a construction including an exchange ROM which is provided for a program exchange, for example, in a case where an exchange ROM is soldered to a microprocessor, there is required a considerably long period of time to replace an executable program with a new object program. Furthermore, to guarantee reliability of operation of the microprocessor, the number of ROM change operations is disadvantageously limited.

SUMMARY OF THE INVENTION

It is therefore a primary object of the present invention to provide a method of and an apparatus for rewriting an object program for use with a plurality of microprocessors in which the number of circuits additionally required thereto can be reduced.

Another object of the present invention is provide a method of and an apparatus for simply rewriting at a high speed the contents of a PROM previously written with an executable program for microprocessors.

In order to achieve the primary object according to the present invention, there are disposed at least two microprocessor systems each including a microprocessor and a PROM connected via a system bus to the microprocessor and written with an executable program of the microprocessor and a control circuit disposed between the system buses for controlling the PROMs and the system buses. The processor of one of the systems releases the system bus of the other system and then initiates the control circuit to rewrite the contents of the PROM of the other system via the system bus of the other system.

The other object of the present invention is achieved, for example, by adopting as the PROM in the microprocessor system an electrically erasable ROM (EEPROM) such as a flash EEPROM.

In accordance with the conventional technologies described above, the ROM or RAM in which an executable program for a microprocessor is written is connected only to an internal bus thereof. Namely, the memory is not connected to the system bus of the system including the microprocessor.

The inventors of the present invention have paid attention to a microprocessor system of a configuration in which the PROM written with an executable program is connected to a system bus thereof such that the program is read therefrom by a pertinent microprocessor via the system bus. In this construction, when the system bus is released, a new program can be written in the PROM from an external device.

Moreover, on the other hand, the inventors also have borne in mind that there have been increasingly installed a system in which a plurality of microprocessor systems are disposed in respective separate units such as optical disk recording devices so that the devices conduct functions mutually different from each other. In this situation, if it is possible to allocate one of the plural processors to a program rewriting operation of a PROM in another microprocessor, the program replacement is accomplished without any additional processor.

According to the present invention, the floppy disk driving device or the exchange ROM to rewrite an object program of microprocessors as well as a PROM rewriting device dedicated to the program replacement can be dispensed with. Consequently, the executable program of microprocessors can be rewritten with a reduced number of additional circuits.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Referring now to the accompanying drawings, description will be given of an embodiment according to the present invention.

Figure 1:
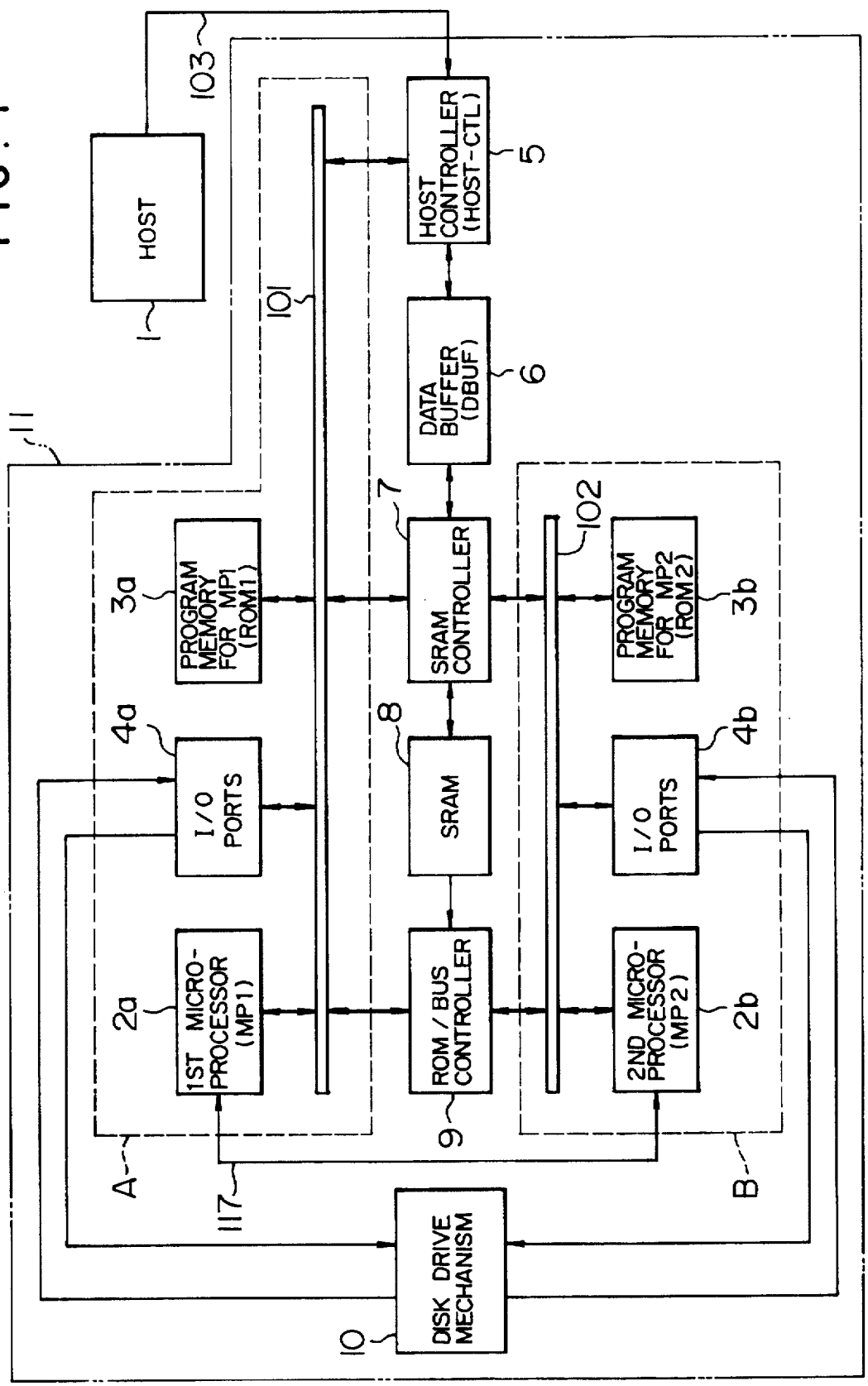
FIG. 1 is a diagram schematically showing the overall configuration of a program rewriting apparatus in an embodiment according to the present invention.

FIG. 1 shows the structure of a magneto-optical disk recording apparatus of a two-processor system to which the present invention is applied.

In the configuration of FIG. 1, a magneto-optical disk recording apparatus 11 includes a first microprocessor system A and a second microprocessor system B. The system A controls data write/read operations in a magnetooptical disk driving mechanism 10; whereas, the system B supervises an operation to drive a read/write head in the mechanism 10.

The system A includes a first microprocessor (MP1) 2a, a program memory (ROM1) 3a for storing therein executable programs of the processor 2a, I/O ports 4a for communicating data between the system A and an external section, and a system 101 connected to the processor 2a, the memory 3a, and the I/O ports 4a. The system B includes a second microprocessor (MP2) 2b, a program memory (ROM2) 3b for storing therein object programs of the processor 2b, I/O ports 4b for communicating data between the system B and an external section, and a system 102 connected to the processor 2b, the memory 3b, and the I/O ports 4b.

Between a host computer 1 and the recording device 11, data is transferred via a host controller (Host-ctl) 5. The controller 5 is also connected to the bus 101. Data is transferred from the controller 5 to a data buffer 6. The data in the buffer 6 is read therefrom to be written in a static RAM (SRAM) 8 under control of an SRAM controller 7. The data in the memory 8 can be accessed from the systems A and B through the controller 7. Form the memory 8, the data can be transferred via an ROM/bus controller 9, which is a advantageous aspect of the present invention, onto the system buses 101 and 102 respectively in the systems A and B, which will be described later.

In the constitution of FIG. 1, new data prepared for a program memory rewrite operation is sent from the host computer 1 via the controller 5 to be stored in the buffer (DBUFF) 6. The data is fed therefrom via the controller 7 to the memory (SRAM) 8.

In this state, when it is desired to rewrite a program in the memory 3a, rewrite data is transferred via the bus 101 thereto under control of the processor 2b. On the other hand, when rewriting a program in the memory 3b, rewrite data is transferred thereto via the bus 102 under control of the processor 2a.

Figure 2:
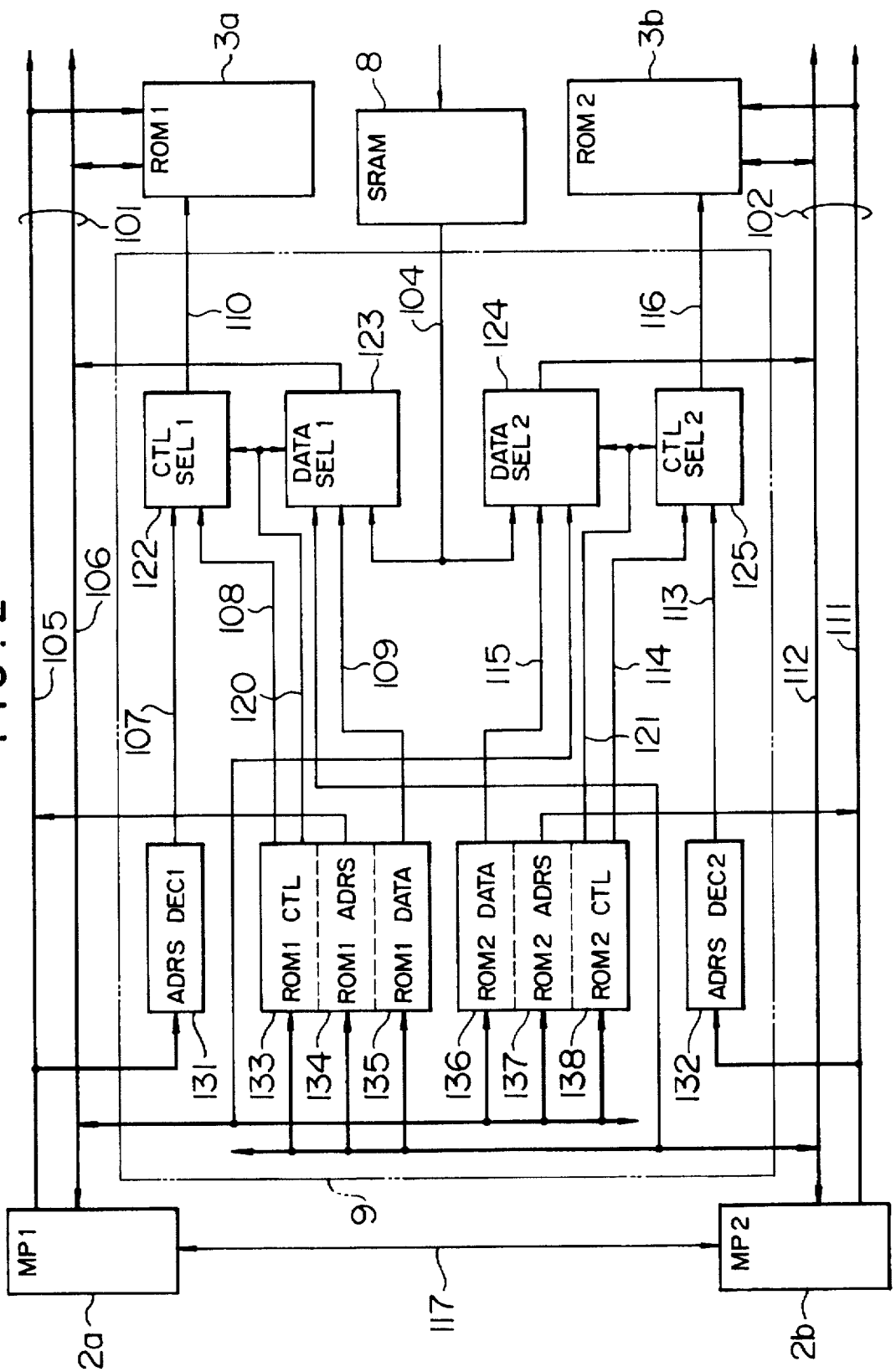
FIG. 2 is a diagram specifically showing the structure of a primary portion of the embodiment.

Subsequently, FIG. 2 shows a detailed circuit constitution necessary to rewrite the program memory 3a or 3b. In this connection, each rewrite data is assumed to have been beforehand stored in the memory 8. Moreover, FIG. 3 shows a flow of processing conducted by the processor 2b to rewrite a program in the memory 3b.

First, description will be given of an operation to rewrite a program in the memory 3a. In any case other than the program rewrite operation in the memory 3a, an address and data of the memory 3a are respectively specified by an address bus 105 and a data bus 106 of the processor 2a. In addition, a control signal 110 such as a chip select signal or an out enable signal to the memory 3a is produced as follows. Namely, a signal 107 attained by decoding a signal on the bus 105 of the processor 2a by an address decoder (ADRS DEC 1 block) 131 is selected by a selector (CTL SEL1 block) 122 and is then directly outputted therefrom as the control signal 110. In response to the signal 110, the processor 2a can acquire the contents of the memory 3a.

Figure 3:
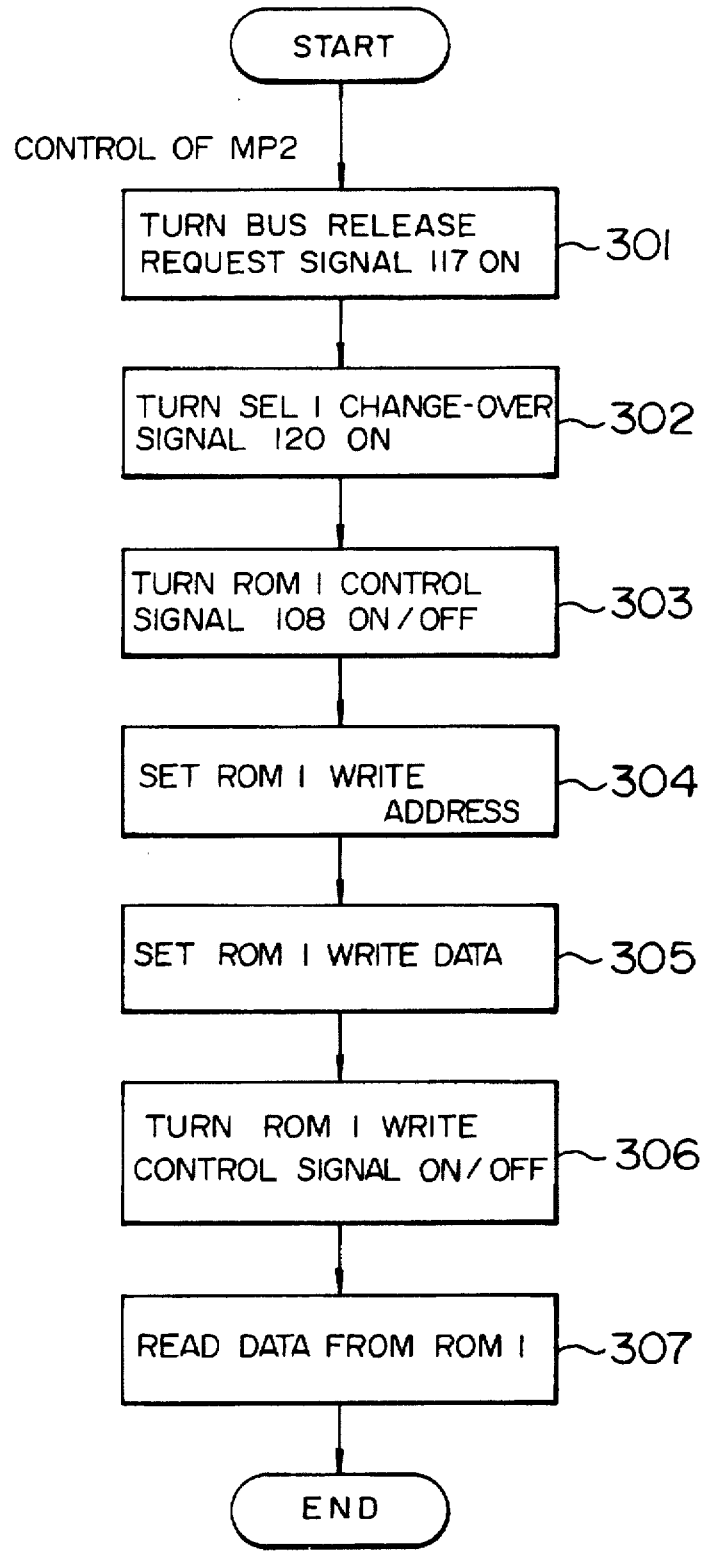
FIG. 3 is a flowchart showing a processing procedure of a microprocessor MP2 to write a program in a program memory ROM1 of FIG. 2.

When rewriting a program in the memory 3a, the processor 2b turns a release request signal 117 on to issue a release request to the processor 2a such that the processor 2a in turn releases the system bus 101, namely, the address bus 105 and the data bus 106 of the processor 2a (step 301 of FIG. 3). Next, the processor 2b turns a SEL1 change-over signal 120 on to request the selector section 122 to select a control signal 108 outputted from an ROM1 CTL block 133 controlled by the processor 2b (step 302). In this manner, the signal 110 is controlled by the processor 2b.

Furthermore, in response to the signal 120, the data of the memory 3a is delivered via an ROM1 DATA block 135 and a DATA SEL1 block 123 controlled by the processor 2b to the data bus 106 connected to the memory 3a (step 303).

In this regard, in the program rewrite operation, an address of the memory 3a is outputted via an ROM ADDS block 134 controlled by the processor 2b onto the released address bus 105. Reference is to be made to that the sections 133 to 138 respectively include registers in which the processor 2a or 2b can write data.

In the above configuration, the processor 2b sets an address of the memory 3a via the block 134 (step 304). After reading from the memory 8 data to be written in the memory 3a, the processor 2b stores the data via a DATA SEL2 block 124 and a data bus 112 in a register of the block 135 (step 305). Moreover, the processor 2b produces and sends necessary control signals to the memory 3a in a sequence set to the block 133 to achieve the rewrite operation of the memory 3a (step 306). In addition, to accomplish a data check after the rewrite operation, the processor 2b activates the block 133 to set the memory 3a to a read state so as to transfer data read therefrom via the data bus 106 and the block 124 onto the data bus 112. The processor 2b checks the transferred data to decides whether or not the data is correct (step 307).

Next, description will be given of a program rewrite operation in the memory 3b. In any case other than the program rewrite operation in the memory 3b, an address and data of the memory 3b are specified by an address bus 111 and the data bus 112 of the processor 2b. A control signal 116 such as a chip select or out enable signal to the memory 3b is produced as follows. A CTL SEL2 block 125 issues an SEL2 change-over signal 121 to select a control signal 113 attained by decoding a signal on the bus 111 of the memory 3b by an ADRS DEC2 section 125. As a result, the signal 113 is outputted as the control signal 116 to the memory 3b. Accordingly, the processor 2b can acquire the contents of the memory 3b.

In a rewrite operation of a program in the memory 3b, the processor 2a sends a release request signal 117 to the processor 2b to release the system bus 102, namely, the address bus 111 and the data bus 112 of the processor 2b. Subsequently, the processor 2a indicates the block 125 to select as the signal 116 a control signal 114 created from an ROM2 CTL section 138 controlled by the processor 2a. The processor 2a thereby controls the signal 116.

The address and data of the memory 3b are fed via the circuits 137, 136, and 124 controlled by the processor 2a to the memory 3b.

In the structure described above, the processor (MP1) 2a sets the address of the memory (ROM2) 3b via the circuit 137. After reading from the memory 8 data to be written in the memory 3b, the processor 2a stores the attained data in the data block 136 via the circuit 123 and the data bus 106. Moreover, the processor 2a creates and transmits necessary control signals to the memory 3b according to the sequence established in the controller 138, thereby carrying out the rewrite operation of the program in the memory 3b. In addition, the data thus stored in the memory 3b is checked as follows. The processor 2a initiates the selector section 123 to set the memory 3b to the read state according to the specification set in the selector 123 so as to transfer the read data via the data bus 112 and the block 123 to the data bus 106. The processor 2a references the data to determine whether or not the data written in the memory 3b is appropriate.

According to the embodiment, there are unnecessitated the floppy disk driving apparatus conventionally required to rewrite the contents of the microprogram and the devices dedicated in the prior art to the operations associated with the program rewriting (such as ROM writing and erasing operations). Furthermore, since the rewrite operation is accomplished under control of the processor, there may employed program memory elements produced for general purposes to some extent. In an operation in which a microprocessor rewrites a program of another microprocessor, the pertinent system bus is released. Consequently, the microprocessor achieves the rewrite operation without any error. Moreover, the data check after the rewrite operation increases reliability of the written data.

In the description of the embodiment, there are utilized two microprocessor systems. However, according to the present invention, there can be similarly implemented a more generalized configuration including more than two microprocessor systems.

In addition, in a case where there are arranged a microprocessor system and a program ROM which belongs to the microprocessor and which has not a function to rewrite a program therein by itself, there may be additionally installed an ROM in which a program controlling the rewrite operation is loaded. In a program rewrite operation, the rewriting program is read therefrom to control the rewrite operation.

Moreover, the control circuit of FIG. 2 may be configured as follows. The memory 3a is not modified, namely, there is included the ROM1. The memory 3b includes an RAM. A program for the microprocessors 2a and 2b is stored in the memory (ROM) 3a. Each time the system is powered, the microprocessor (MP1) 2a reads the program for the microprocessor (MP2) 2b from the ROM 3a to load the program in the RAM 3b. In accordance with the structure, after the system power is turned on, the microprocessors 2a and 2b operate according to the contents of the ROM 3a and the RAM 3b, respectively. When the power is turned off, although only the contents of the RAM 3b are lost, the system operation can be advantageously continued without any trouble. In this situation, the operation to rewrite the program in the ROM 3a for both microprocessors 2a and 2b is accomplished also under control of the processor 2b.

As specifically described above, according to the present invention, a rewritable memory is employed as a program storage memory disposed for each of a plurality of microprocessor systems, for example, two microprocessor systems including first and second systems, respectively. In this constitution, the contents of the program memory associated with the microprocessor of the first system are written under control of the microprocessor of the second system, and vice versa. Consequently, the separate media and devices necessary for the conventional program rewriting apparatus to rewrite the program can be dispensed with. There is attained an advantageous effect that each microprocessor can flexibly rewrites the contents of a program memory externally attached to another microprocessor at a high speed without any error.

Furthermore, using as the program memory an electrically erasable PROM (EEPROM) such as a flash memory, there is attained an advantageous aspect that the program can be rewritten at a high speed without deteriorating the program performance.

While the present invention has been described with reference to the particular illustrative embodiment, it is not to be restricted by those embodiment but only by the appended claims. It is to be appreciated that those skilled in the art can change or modify the embodiment without departing from the scope and spirit of the present invention.

We claim:

1. A method of rewriting, by a first microprocessor in a first microprocessor system, contents of a program memory for a second microprocessor in a second microprocessor system and vice versa, said first microprocessor system including said first microprocessor, a first rewritable program memory for storing therein an executable program for said first microprocessor, and a first system bus connected to said first microprocessor and said first rewritable program memory, and said second microprocessor system including said second microprocessor, a second rewritable program memory for storing therein an executable program for said second microprocessor, and a second system bus connected to said second microprocessor and said second rewritable program memory, said second system bus being separate from said first system bus, said method comprising the steps of:

releasing said second system bus by said second microprocessor, in response to a request from said first microprocessor;

supplying from said first system bus an address on said second system bus thus released under control of said first microprocessor;

reading data of a new program from a common memory connected to said first and second system buses and commonly accessible by said first and second microprocessors under control of said first and second microprocessors;

supplying from said first system bus the data thus read on said second system bus thus released under control of said first microprocessor; and rewriting the data thus supplied on said second system bus in said second program memory by performing data write operation of said second program memory under control of said first microprocessor.

2. A method according to claim 1, wherein said rewriting step further includes the steps of:

reading, under control of said first microprocessor, data after rewrite operation of said second rewritable program memory on said second system bus which has been released; and transferring, under control of said first microprocessor, the data after rewrite operation thus read to said first system bus, thereby confirming correct rewrite operation by said first microprocessor.

3. A method according to claim 1, wherein said second program memory is an electrically erasable read only memory.

4. An apparatus for rewriting, by a first microprocessor in a first microprocessor system, contents of a program memory for a second microprocessor in a second microprocessor system and vice versa, comprising:

said first microprocessor system, including said first microprocessor, further includes a first rewritable program memory for storing therein an executable program for said first microprocessor, and a first system bus connected to said first microprocessor and said first rewritable program memory;

said second microprocessor system, including said second microprocessor, further includes a second rewritable program memory for storing therein an executable program for said second microprocessor, and a second system bus connected to said second microprocessor and said second rewritable program memory, said second system bus being separate from said first system bus;

storage means connected to said first and second system buses, for storing therein a new program for a rewrite operation, said storage means being commonly accessible for a read operation from said first and second microprocessors through said first and second system buses, respectively under control of said first and second microprocessors;

a request line for transmitting a request from said first microprocessor to said second microprocessor to cause said second microprocessor to release said second system bus; and means connected between said first and second system buses for replacing, in accordance with execution under control of said first microprocessor, contents of said second rewritable program memory with contents of said storage means by reading data from said storage means on said first system bus and transferring the data thus read to said second system bus after said second system bus is released by the request from said first microprocessor.

5. An apparatus according to claim 4, wherein said replacing means includes:

means, operative after said second microprocessor releases said second system bus in response to the request from said first microprocessor, for supplying from said first system bus an address on said second system bus which has been released, under control of said first microprocessor;

means for reading, under control of said first microprocessor, data from said storage means on said first system bus, and transferring the data thus read to said second system bus which has been released; and means for rewriting, under control of said first microprocessor, the data thus transferred on said second system bus in said second rewritable program memory.

6. An apparatus according to claim 5, wherein said rewriting means includes:

means for reading, under control of said first microprocessor, data of said second rewritable program memory after rewrite operation on said second system bus which has been released; and means for transferring, under control of said first microprocessor, the data after rewrite operation thus read onto said first system bus, thereby confirming correct rewrite operation by said first microprocessor.

7. An apparatus according to claim 4, wherein said second program memory is an electrically erasable read only memory.

8. A program rewriting apparatus comprising:

a first microprocessor system including a first microprocessor, a first rewritable memory for storing a program and a first system bus connected to said first microprocessor and said first rewritable memory, said first microprocessor reading out the program stored in said first rewritable memory through said first system bus to execute the program read out;

a second microprocessor system including a second microprocessor, a second rewritable memory for storing a program and a second system bus connected to said second microprocessor and said second rewritable memory, said second system bus being separate from said first system bus, and said second microprocessor reading out the program stored in said second rewritable memory through said second system bus to execute the program read out from said second rewritable memory, independently of execution by said first microprocessor;

a common memory provided to be accessible commonly to said first and second microprocessor systems under control of said first and second microprocessor systems; and a controller connected to said first and second microprocessor systems and responsive to a request from a microprocessor of one microprocessor system, for causing a microprocessor of the other microprocessor system to release a system bus of said the other microprocessor system, so that the microprocessor of said one microprocessor system rewrites contents of a rewritable memory of the other microprocessor system using an update program stored in said common memory.

9. An apparatus according to claim 8, wherein said controller comprises:

means for assigning an address on a system bus of the other microprocessor system, in accordance with execution by a microprocessor of said one microprocessor system;

means for assigning data on a system bus of the other microprocessor system in accordance with execution by the microprocessor of said one microprocessor system, said data being read out from said common memory; and means for writing data on the system bus of the other microprocessor system in a rewritable memory of the other microprocessor system, under control of the microprocessor of said one microprocessor system.

10. An apparatus according to claim 9, wherein said controller further comprises:

means for transferring data on the system bus of the other microprocessor system read out after rewriting operation from a rewritable memory of the other microprocessor system to a system bus of said one microprocessor system, in accordance with execution by the microprocessor of said one microprocessor system, so that the microprocessor of said one microprocessor system checks data after rewriting operation stored in the rewritable memory of the other microprocessor system.

11. An apparatus according to claim 8, wherein said rewritable memories include an electrically erasable read only memory.

12. An apparatus according to claim 8, wherein in an ordinary state, said first microprocessor controls data read/write operation of a disk drive and said second microprocessor controls driving operation of heads in said disk drive.

13. A disk device comprising:

a first microprocessor system for controlling data read/write operation of a disk drive, said first microprocessor system including a first microprocessor, a first rewritable memory for storing a program and a first system bus connected with said first microprocessor and said first rewritable memory, said first microprocessor reading out the program stored in said first rewritable memory through said first system bus to execute the program read out;

a second microprocessor system for controlling driving operation of heads in said disk drive, said second microprocessor system including a second microprocessor, a second rewritable memory for storing a program and a second system bus connected with said second microprocessor rand said second rewritable memory, said second system bus being separate from said first system bus, and said second microprocessor reading out the program stored in said second rewritable memory through said second system bus to execute the program read out from said second rewritable memory, independently of execution by said first microprocessor;

a common memory provided to be accessible commonly to said first and second microprocessor systems under control of said first and second microprocessor systems; and a controller connected with said first and second microprocessor systems and responsive to a request from a microprocessor of one microprocessor system, for causing a microprocessor of the other microprocessor system to release a system bus of said other microprocessor system, so that the microprocessor of said one microprocessor system rewrites contents of a rewritable memory of said other microprocessor system using an update program stored in said common memory.

14. A disk device according to claim 13, wherein said controller comprises:

means for assigning an address on a system bus of said other microprocessor system, under control of a microprocessor of said one microprocessor system;

means for assigning data on a system bus of said the other microprocessor system, under control of the microprocessor of said one microprocessor system, said data being read out from said common memory; and means for writing data on the system bus of said the other microprocessor system in a rewritable memory of said other microprocessor system under control of the microprocessor of said one microprocessor system.

15. A disk device according to claim 14, wherein said controller further comprises:

means for transferring data on the system bus of said other microprocessor system read out after rewriting operation from a rewritable memory of said other microprocessor system to a system bus of said one microprocessor system, under control of the microprocessor of said one microprocessor system, so that the microprocessor of said one microprocessor system checks data after rewriting operation stored in the rewritable memory of said other microprocessor system.

16. A disk device according to claim 13, wherein said rewritable memories include an electrically erasable read only memory.

* * * * *